(12) United States Patent
Ivanov et al.

(10) Patent No.: US 10,274,845 B2
(45) Date of Patent: Apr. 30, 2019

(54) OPTICAL MODULE WITH AN ADJUSTABLE OPTICAL ELEMENT

(75) Inventors: Ivan Ivanov, Aachen (DE); Taoufik Mbarek, Bietigheim-Bissingen (DE); Mathias Huesing, Aachen (DE); Burkhard Corves, Hergenrath (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 2008 days.

(21) Appl. No.: 13/091,457

(22) Filed: Apr. 21, 2011

(65) Prior Publication Data
US 2011/0261341 A1 Oct. 27, 2011

(30) Foreign Application Priority Data
Apr. 23, 2010 (DE) .................. 10 2010 018 224

(51) Int. Cl.
*G03B 27/54* (2006.01)
*G03F 7/20* (2006.01)
*G02B 7/182* (2006.01)

(52) U.S. Cl.
CPC ....... *G03F 7/70825* (2013.01); *G02B 7/1827* (2013.01); *G03B 27/54* (2013.01); *G03F 7/70808* (2013.01); *G03F 7/70833* (2013.01)

(58) Field of Classification Search
CPC ... G02B 7/1827; G02B 7/023; G03F 7/70825; G03F 7/70808; G03F 7/70833; G03F 7/709
USPC .... 355/52, 53, 55, 67–71, 77; 359/811, 813, 359/819, 822–826, 871–876; 250/492.1, 250/492.2, 492.22
See application file for complete search history.

(56) References Cited

U.S. PATENT DOCUMENTS

| | | | |
|---|---|---|---|
| 2002/0163741 A1 | 11/2002 | Shibazaki | |
| 2007/0216888 A1* | 9/2007 | Kugler | G02B 7/023 355/67 |
| 2008/0117534 A1* | 5/2008 | Onuki | G02B 7/023 359/824 |

(Continued)

FOREIGN PATENT DOCUMENTS

| | | |
|---|---|---|
| JP | 2000-66075 | 3/2000 |
| JP | 2008-111891 | 5/2008 |
| WO | WO 2005/101131 | 10/2005 |

OTHER PUBLICATIONS

Japanese Office Action, with translation thereof, for JP Appl No. 2011-096245, dated Jan. 27, 2015.

(Continued)

*Primary Examiner* — Christina A Riddle
(74) *Attorney, Agent, or Firm* — Fish & Richardson P.C.

(57) ABSTRACT

An optical module, in particular for microlithography, includes an optical element and a support unit. The optical element has at least one optically utilized area, which defines a rotational axis of symmetry. To support the optical element the support unit has a plurality of more than three support elements. Each of the support elements in the area of a first end is connected with the optical element and in the area of a second end is connected with the support structure. The support unit is designed such that the degree of freedom of rotation of the optical element around the rotational axis of symmetry is restricted, while the position or orientation of the optical element in the other five degrees of freedom is spatially adjustable via the support unit.

20 Claims, 9 Drawing Sheets

(56) References Cited

U.S. PATENT DOCUMENTS

2012/0067833 A1* 3/2012 Kugler .................. G02B 7/003
                                                      211/13.1
2016/0266381 A1* 9/2016 Honsho .................... G03B 5/00

OTHER PUBLICATIONS

Korean Office Action, with English translation thereof, for KR Appln. No. 10-2011-0037620, dated Jul. 26, 2017, 8 pages.

* cited by examiner

OPTICAL MODULE WITH AN ADJUSTABLE OPTICAL ELEMENT

CROSS-REFERENCE TO RELATED APPLICATIONS

This application claims priority under 35 U.S.C. § 119 to German Application No. 10 2010 018 224.9-51, filed Apr. 23, 2010. The contents of this application is hereby incorporated by reference in its entirety.

FIELD

The present disclosure relates to an optical module, an optical imaging device and a method for supporting an optical element, which are in particular suited to application in microlithography. The disclosure can be used in conjunction with an arbitrary optical imaging method. In particular it can be used in conjunction with the manufacture and/or inspection of microelectronic circuits.

BACKGROUND

In particular in the area of microlithography, apart from the use of components designed to have the highest possible precision, it is among other things desirable to position the components of the imaging device, thus for example the optical elements (lenses, mirrors etc.), the mask with the projection pattern to be imaged and the substrate to be exposed, as accurately as possible in relation to one another, in order to achieve a correspondingly high imaging quality. The desire for high accuracy, which lies in the microscopic area at an order of magnitude of a few nanometers or less, is nonetheless the result of the constant desire to increase the resolution of the optical systems used in the manufacture of microelectronic circuits, in order to push miniaturization of the microelectronic circuits to be manufactured.

With the increased resolution and the reduction in the wavelength of the light used which as a rule accompanies this, the desired accuracy properties in the positioning and orientation of the components used naturally become greater. This naturally has an effect, for the low working wavelengths in the UV range used in microlithography (for example of around 193 nm), but in particular in the so-called extreme UV (EUV) range between 5 nm and 20 nm (typically around 13 nm), on the effort that has to be made to meet the high desired accuracy properties in the positioning and/or orientation of the components involved.

For the positioning and/or orientation of the optical elements used in the imaging, in particular in microlithography, usually two different approaches are followed.

According to a first approach, so-called parallel kinematics can be used for this, typically in the form of so-called hexapods, in which six support elements that can be adjusted independently of one another are able to spatially position and orient the optical element typically in all six degrees of freedom. The support elements as a rule in each case restrict precisely one degree of freedom (that is to say the degree of freedom of translation in the direction of the longitudinal axis of the support element concerned), so that a statically determined support of the optical element is achieved. The kinematically parallel arrangement of the support elements offers the advantage of comparatively simple control since for all support elements the same local referencing system can be used in a simple manner so that an adjustment of one of the support elements does not have an effect on the local referencing system of one the other support elements. Such hexapods are for example known from US 2002/0163741 A1 to Shibazaki, the entire disclosure of which is included herein by reference. With such hexapods it can be possible to achieve virtually any positioning and orientation of the optical element within the space available. However, they have a comparatively complex design. In particular, for each of the six support elements a separate, independently operated actuator unit is involved, which can make it difficult to integrate the actuator system into available installation space.

A second approach involves so-called tripods, in which the optical element is supported by three adjustable support elements on a support structure. Each support element restricts in each case precisely two degrees of freedom, so that here also a statically determined support of the optical element is achieved. Such a tripod is known for example from US 2002/0163741 A1 to Shibazaki and WO 2005/101131 A1 otKugler et al., the entire disclosure of both of which is included herein by reference. Such a tripod uses a smaller number of support elements, which involves less installation space. Within certain limits, any adjustment of the spatial position and/or orientation of the optical element is also basically possible using such tripods. However, for this it may be desirable to provide serial kinematics, but, because of the interdependency of the adjusting movements, the control can become more complicated. Further, the comparatively few support points of the optical element, in particular for large and heavy optical elements, however, may represent an undesirable feature of these tripods, because the effects of deformation of the optical element under its own weight (for example the so-called three-wave deformation) may be further exacerbated.

SUMMARY

The present disclosure provides an optical module, an optical imaging device and a method for supporting an optical element, which do not have the abovementioned disadvantages, or at least only to a lesser extent, and which in particular in a simplified manner allow accurate spatial positioning and/or orientation of the optical element.

The present disclosure is based on the recognition that for certain applications, in which the optically utilised area of the optical element defines a rotational axis of symmetry, the complexity of the support element can be reduced by dispensing with the adjusting possibility of the angular position of the optical element around this rotational axis of symmetry of the optically utilised area. Here it is assumed that on the basis of the rotational symmetry of the optically utilised area, it may be that no benefit to speak of can be obtained any way from adjusting the angular position or that the imaging errors, which arise from a deviation of the rotational symmetry of the optically utilised area, through suitable and sufficiently known measures can be corrected at other points in the optical system in a simpler manner, so that there is no need for adjusting the angular position of the optical element around the rotational axis of symmetry. This allows firstly one support element with the associated actuator system to be dispensed with so that the complexity of the support device is reduced. In addition it is in this way possible to create parallel kinematics with the associated advantages in terms of control or adjustment of the position and/or orientation of the optical element.

In particular, it is possible to create simplified parallel kinematics, designed in the form of a pentapod with five support elements, so that compared with the known hexapods a simplified design can be achieved in terms of the effort and the structure, while even support can be provided in a simpler manner compared with known tripods. Here, support devices with, in each case, individual support elements, thus designed as monopods, can be created. Similarly it is of course possible to group individual support elements into one or more bipods.

The restriction of the degree of freedom of rotation around the rotational axis of symmetry of the optically utilised area can be achieved in a simple manner via at least one of the support elements. Preferably to this end it is provided that at least one of the support elements restricts a degree of freedom of rotation around an axis of rotation, which has at least one direction component parallel to the rotational axis of symmetry.

According to one aspect the present disclosure therefore relates to an optical module, in particular for microlithography, with an optical element and a support unit, wherein the optical element has at least one optically utilised area which defines a rotational axis of symmetry. To support the optical element the support unit has more than three support elements, wherein each of the support elements in the area of a first end is connected with the optical element and in the area of a second end is connected with a support structure. At least one support element restricts precisely one first degree of freedom, wherein the first degree of freedom is a degree of freedom of rotation around an axis of rotation and the axis of rotation is aligned in such a way that it has at least one direction component parallel to the rotational axis of symmetry.

According to a further aspect the present disclosure relates to an optical imaging device, in particular for microlithography, with an illumination device with a first optical element group, a mask device to receive a mask with a projection pattern, a projection device with a second optical element group and a substrate device to receive a substrate, wherein the illumination device is designed to illuminate the projection pattern and the projection device is designed to project the projection pattern onto the substrate. The illumination device and/or the projection device includes an optical module according to the disclosure.

According to a further aspect the present disclosure relates to a method for supporting an optical element, in particular for microlithography, in which the optical element, having at least one optically utilised area defining a rotational axis of symmetry, is supported by more than three support elements of a support unit on a support structure. By means of at least one support element precisely one first degree of freedom is restricted, wherein the first degree of freedom is a degree of freedom of rotation around an axis of rotation and the axis of rotation is aligned in such a way that it has at least one direction component parallel to the rotational axis of symmetry.

According to a further aspect the present disclosure relates to an optical module, in particular for microlithography, with an optical element and a support unit, wherein the support element for supporting the optical element has a plurality of support elements. Each support element in the area of a first end is connected with the optical element and in the area of a second end is connected with a support structure, wherein at least one support element restricts precisely one degree of freedom. The support unit is designed in the form of a pentapod with precisely five support elements.

According to a further aspect the present disclosure relates to an optical imaging device, in particular for microlithography, with an illumination device with a first optical element group, a mask device to receive a mask with a projection pattern, a projection device with a second optical element group and a substrate device to receive a substrate, wherein the illumination device is designed to illuminate the projection pattern and the projection device is designed to project the projection pattern onto the substrate. The illumination device and/or the projection device includes an optical module according to the disclosure.

According to a further aspect the present disclosure relates to a method for supporting an optical element, in particular for microlithography, in which the optical element is supported by a plurality of support elements of a support unit on a support structure, wherein by means of at least one support element precisely one degree of freedom is restricted. The support unit is designed in the form of a pentapod with precisely five support elements.

According to a further aspect the present disclosure relates to an optical module, in particular for microlithography, with an optical element and a support unit, wherein the optical element has at least one optically utilised area, which defines a rotational axis of symmetry. For supporting the optical element the support element has more than three support elements, wherein each of the support elements in the area of a first end is connected with the optical element and in the area of a second end is connected with a support structure. The support unit is designed such that the degree of freedom of rotation of the optical element around the rotational axis of symmetry is restricted, while the position or orientation of the optical element in the other five degrees of freedom is spatially adjustable via the support unit.

According to a further aspect the present disclosure relates to an optical imaging device, in particular for microlithography, with an illumination device with a first optical element group, a mask device to receive a mask with a projection pattern, a projection device with a second optical element group and a substrate device to receive a substrate, wherein the illumination device is designed to illuminate the projection pattern and the projection device is designed to project the projection pattern onto the substrate. The illumination device and/or the projection device includes an optical module according to the disclosure.

Finally, according to a further aspect the present disclosure relates to a method for supporting an optical element, in particular for microlithography, in which the optical element, having at least one optically utilised area, defining a rotational axis of symmetry, is supported by means of more than three support elements of a support unit on a support structure. The support unit restricts the degree of freedom of rotation of the optical element around the rotational axis of symmetry, while the position or orientation of the optical element in the other five degrees of freedom is spatially adjustable via the support unit.

Further preferred embodiments of the disclosure will become apparent from the dependent claims or the description of preferred embodiments given below, which refers to the attached drawings.

DETAILED DESCRIPTION OF THE DISCLOSURE

First Embodiment

By reference to FIGS. 1 to 6 in the following a preferred embodiment of the optical imaging device for microlithography according to the disclosure is described, in which a preferred embodiment of the optical module according to the disclosure is used. Here, to simplify the following description an XYZ coordinate system is introduced in which the Z direction denotes the vertical direction. It is self-evident, however, that with other variants of the disclosure any other spatial alignment of the components of the imaging device can be provided.

Figure 1:
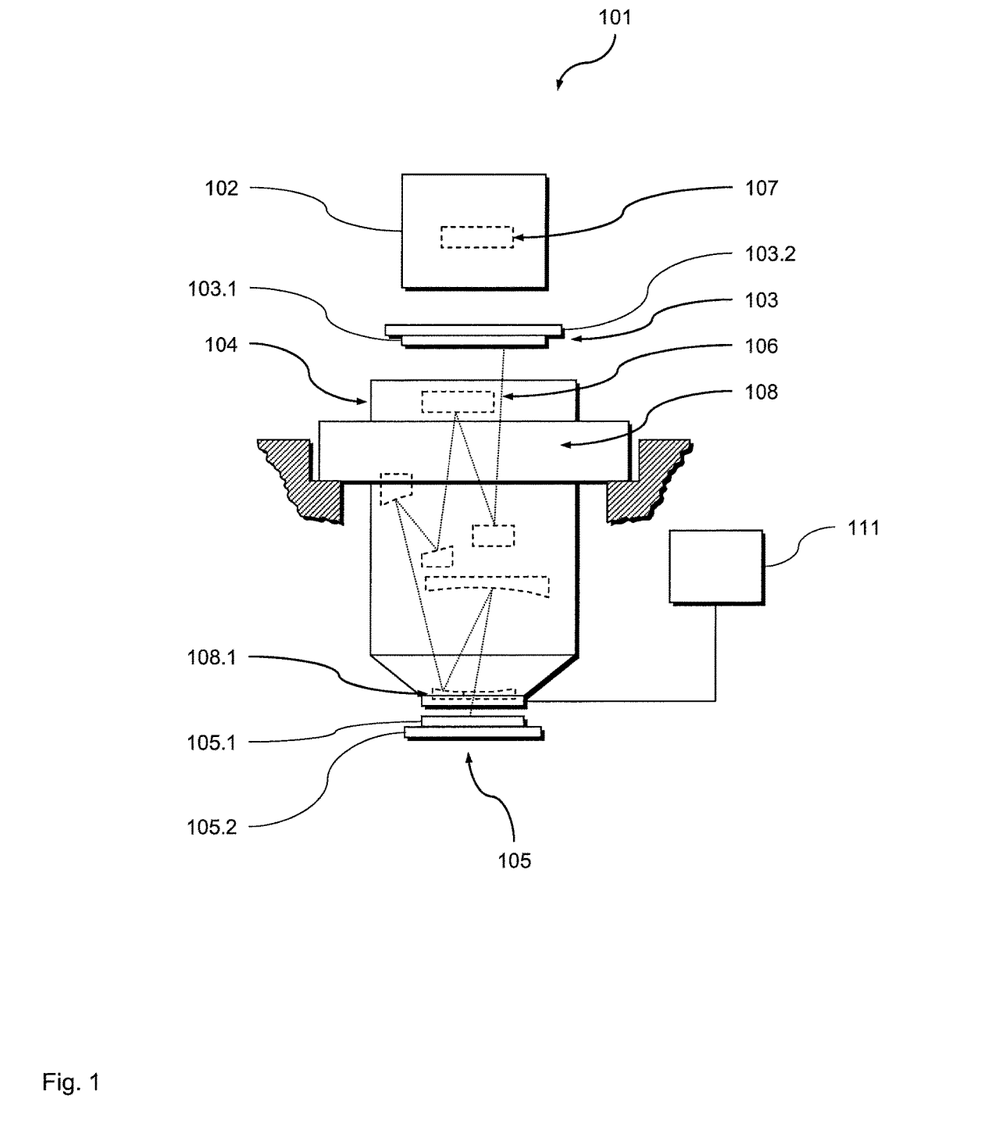
FIG. 1 is a schematic view of a preferred embodiment of the optical imaging device according to the disclosure, including an optical module according to the disclosure and with which a preferred embodiment of a method according to the disclosure for supporting an optical element can be carried out.

FIG. 1 shows a schematic representation of a preferred embodiment of the optical imaging device according to the disclosure in the form of a microlithography device 101, which works with light in the EUV range with a wavelength of 5 nm to 20 nm, in the present example approximately 13 nm.

The microlithography device 101 includes an illumination system 102, a mask device 103, an optical projection system in the form of an objective 104 and a substrate device 105. The illumination system 102 illuminates (via a light guide device, not shown) a mask 103.1, which is arranged on a mask table 103.2 of the mask device 103, with a projection light beam 106 (not shown in greater detail in this area). To this end the illumination system 102 includes, in addition to a light source (not shown) a first optical element group 107 (shown in a highly schematized fashion) with a plurality of first optical elements.

On the mask 103.1 there is a projection pattern, which, using the projection light beam 106, is projected via the optical elements of a second optical element group 108 arranged in the objective 104 onto a substrate in the form of a wafer 105.1, arranged on a wafer table 105.2 of the substrate device 105.

Due to the working wavelength of 13 nm, all the optical elements used in the imaging device 101 are reflective optical elements. It is self-evident, however, that for other variants of the disclosure, which work with light in other wavelength ranges, refractive, reflective and/or diffractive elements may be used alone or in arbitrary combination.

Figure 2:
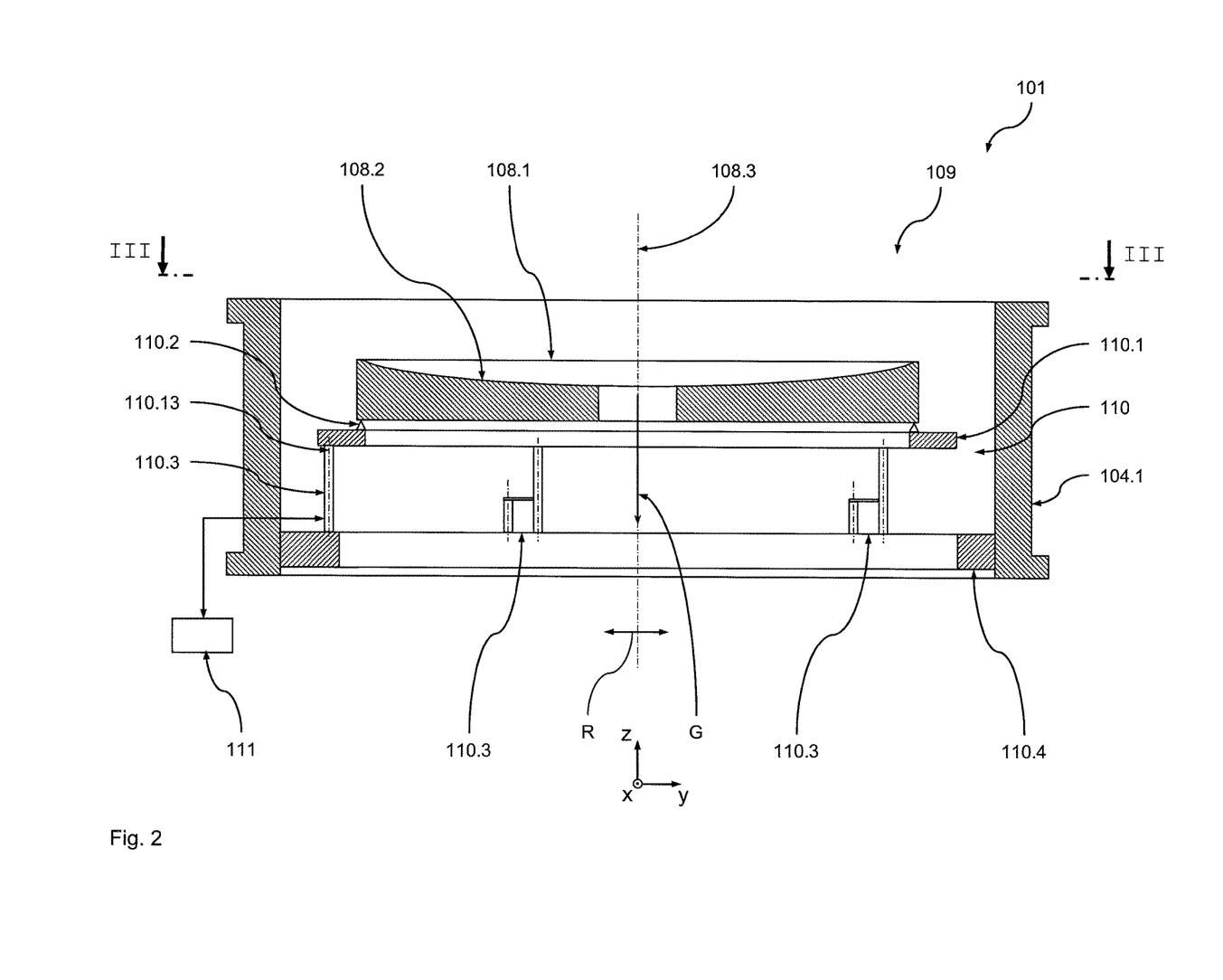
FIG. 2 is a schematic cross-sectional view of a preferred embodiment of the optical module according to the disclosure of FIG. 1 (along line II-II of FIG. 3)

FIG. 2 shows a schematic cross-sectional view of a preferred embodiment of the optical module 109 according to the disclosure, which includes the second optical element of the second optical element group 108 in the form of a mirror 108.1. The mirror 108.1 has an optical surface 108.2 that is optically utilised during the operation of the imaging device 101 (for projection of the projection pattern on the wafer 105.1), defining a rotational axis of symmetry 108.3. The mirror 108.1 also defines a circumferential direction U, which lies in a plane running transversely (in particular perpendicularly) to the rotational axis of symmetry 108.3.

In the present example the mirror 108.1 is the mirror of the second optical element group 108 spatially nearest to the wafer 105.1. It is self-evident, however, that the optical module according to the disclosure in other variants of the disclosure can also include a mirror which is arranged at any other point in the path of the projection light beam. In particular, of course, it can also be provided that the optical module according to the disclosure is used in the illumination device.

Figure 3:
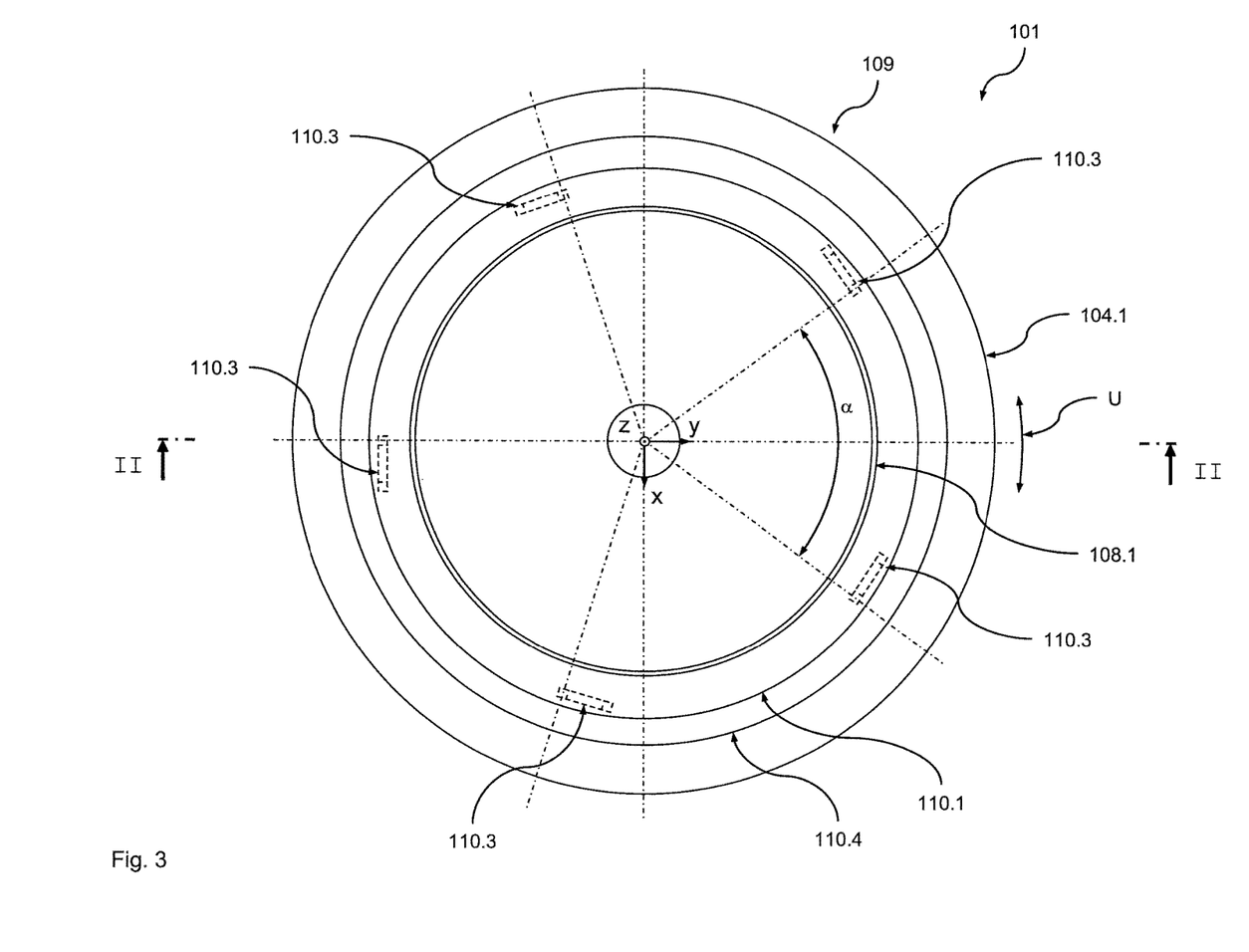
FIG. 3 is a schematic top view of the optical module of FIG. 2 (along line III-III of FIG. 2)

FIG. 3 shows a schematic top view of the optical module 109 from FIG. 2. As can be inferred in particular from FIG. 2, the mirror 108.1 is supported in space by a support unit 110 against the static and dynamic forces acting on it, in particular the gravitational force G, and is thus held spatially in a certain position and orientation.

To this end the support unit 110 includes a retaining element in the form of a retaining ring 110.1 to which the mirror 108.1 is secured through suitable connecting elements 110.2 (shown only in a highly schematized fashion). The connecting elements 110.2 can be designed in any suitable and sufficiently known manner. In particular they can (within certain limits) create a flexible connection between the mirror 108.1 and the retaining ring 110.1. The connection elements can also have a monolithic design with the retaining ring 110.1.

The support unit 110 further includes a plurality of support elements 110.3, the one end of which is connected with the retaining ring 110.1, while its other end is connected with a support structure in the form of a support ring 110.4, so that ultimately the mirror 108.1 is supported via the support elements 110.3 on the support ring 110.4. The support ring 110.4 is for its part connected with a part of the housing 104.1 of the objective 104.

The connection between the respective support element 110.3 and the retaining ring 110.1 or the support ring 110.4 can be designed in any fashion. Thus at least one of these connections can be designed to be releasable. Similarly, however, it can also be provided that at least one of the connections has a monolithic design.

As can be inferred from FIG. 3, in the present example precisely five support elements 110.3 are provided. The support elements 110.3 in the present example are evenly distributed in the circumferential direction U of the mirror 108.1 in the area of the outer circumference of the mirror 108.1. Consequently the support elements 110.3 are arranged in relation to an immediately adjacent support element 110.3 in each case rotated through an angle of α=72° about the rotational axis of symmetry 108.3. It is self-evident, however, that with other variants of the disclosure any other, uneven, distribution of the support elements in the circumferential direction can be provided. Further, it can also be provided, of course, that the support elements are not arranged on a shared circumference, but in the radial direction R of the mirror 108.1 have a different distance from the rotational axis of symmetry 108.3.

Each support element 110.3 is designed as a separate support, hence in the manner of a monopod, so that the support unit 110 overall has the form of a pentapod. Compared with the known hexapod structures, this has the advantage that by simply leaving out one support element a lower proportion of the installation space available, which as a rule is very limited, is involved.

Figure 4:
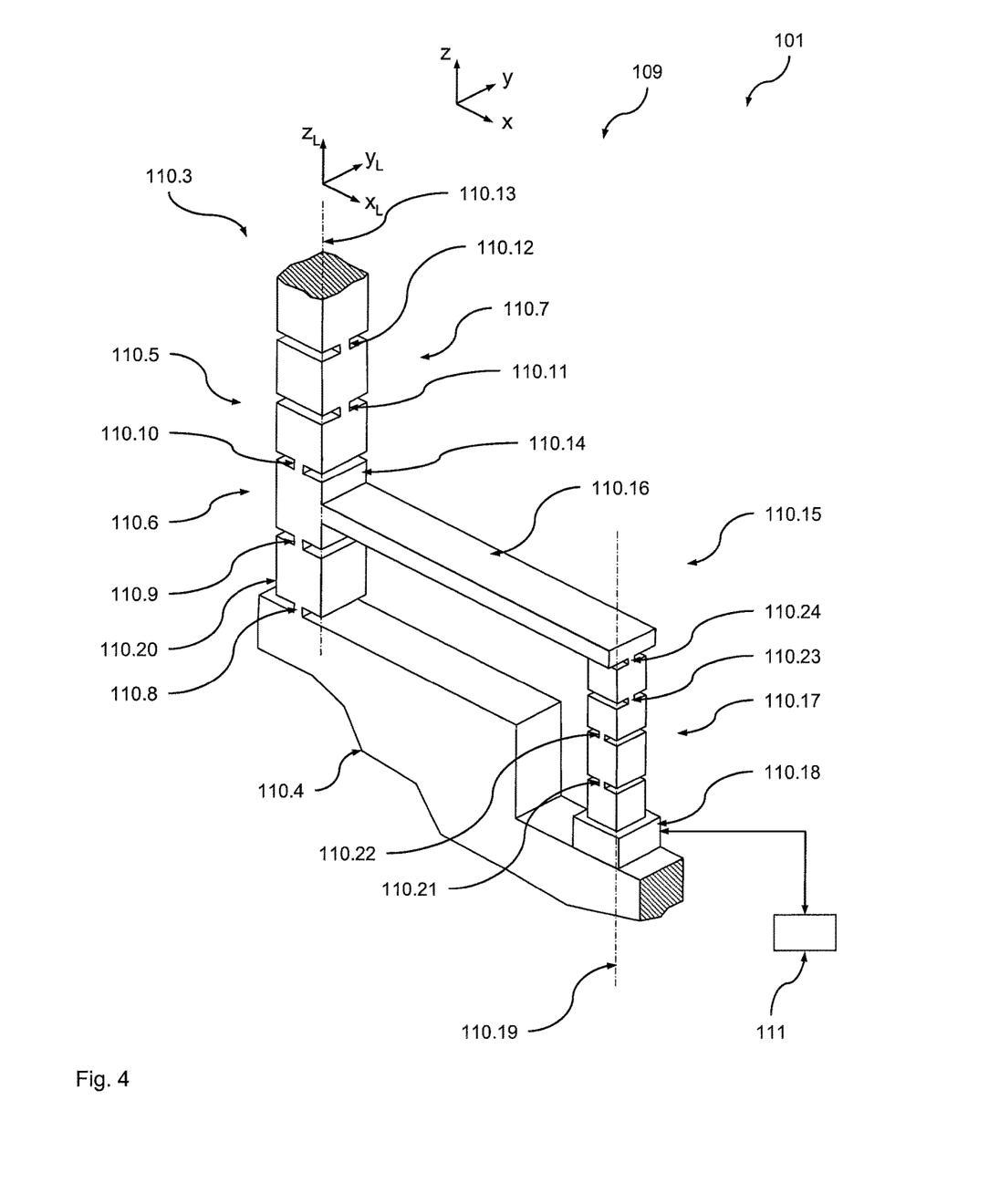
FIG. 4 is a schematic perspective view of a support element in the area of detail IV of FIG. 3.
Figure 5:
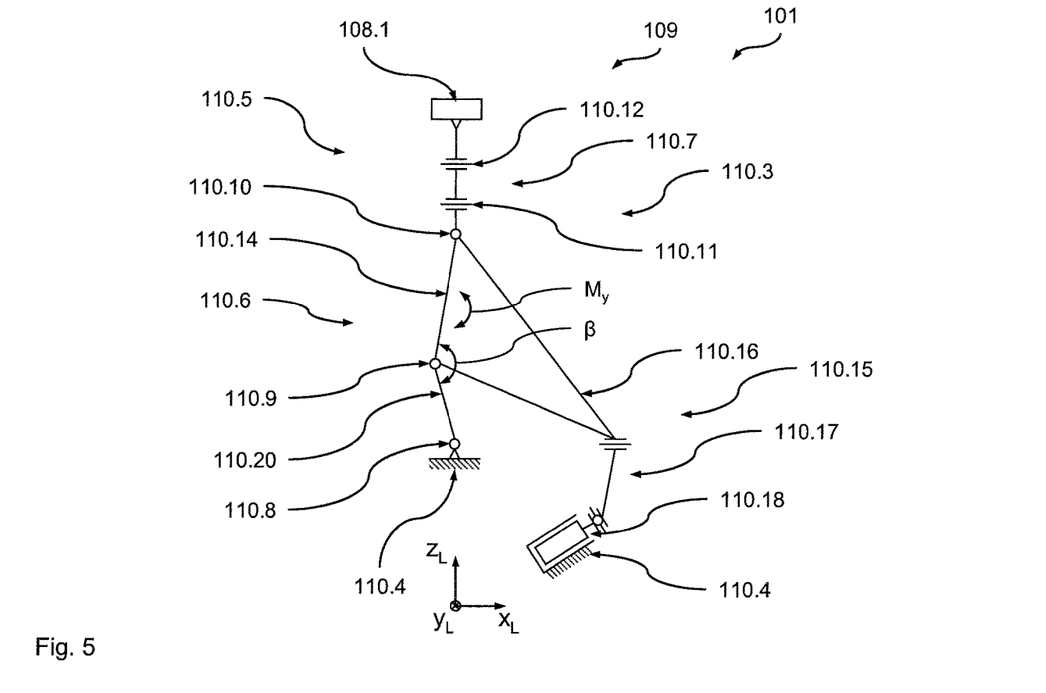
FIG. 5 is a mechanical equivalent diagram of the support element of FIG. 4.

FIG. 4 shows a schematic perspective view of the support element 110.3 (detail IV from FIG. 3) while FIG. 5 shows a mechanical equivalent diagram of the support element 110.3. Here the support element 110.3, for the purposes of clarity, is shown in FIG. 4 in a state in which in its local coordinates system ($X_L$, $Y_L$, $Z_L$), likewise shown in FIG. 4, it has its greatest longitudinal extension along the $Z_L$ axis. In order to allow an adjustment in both directions along the $Z_L$ axis, the support element 110.3 during operation will, however, as a rule have a neutral position, which deviates from the state shown in FIG. 4, as shown in FIG. 5 and will be explained in further detail in the following.

As can be inferred from FIGS. 4 and 5, the support element 110.3 includes a support section 110.5 which includes a first joint group 110.6 of first pivot joints and a second joint group 110.7 of second pivot joints. The first joint group 110.6 includes three first pivot joints 110.8, 110.9 and 110.10, while the second joint group 110.7 includes two second pivot joints 110.11 and 110.12.

In the local coordinate system ($X_L$, $Y_L$, $Z_L$) of the support element 110.3 likewise shown in FIG. 4, the first pivot joints 110.8, 110.9 and 110.10 in each case define a first pivot axis, which is parallel to the $Y_L$ axis, while the second pivot joints 110.11 and 110.12 in each case define a second pivot axis, which is parallel to the $X_L$ axis. Consequently a first pivot axis in each case therefore runs transversely to a second pivot axis.

In this way a configuration of the support element 110.3 is achieved which restricts a first degree of freedom, namely the degree of freedom of rotation around an axis of rotation 110.13 (formed by the longitudinal axis of the support element 110.3 and coinciding with the $Z_L$ axis in the example shown). In all the other five spatial degrees of freedom (thus the three translations in the $X_L$, $Y_L$ and $Z_L$ direction and the two rotations around the $X_L$ and $Y_L$ direction) the support element 110.3 (within certain limits) basically allows unrestricted movements.

As can be inferred from FIG. 4, the support section 110.5 has a monolithic design, so that the pivot joints 110.8 to 110.12 are in each case designed as simple solid body joints. It is self-evident, however, that with other variants of the disclosure any other suitable design of the pivot joints, in particular a multi-part design, can be provided. In particular any combination of differently designed pivot joints can be provided.

The support elements 110.3 are arranged in such a way that the axis of rotation 110.13 (in the state shown in FIG. 4) runs parallel to the rotational axis of symmetry 108.3 of the optically utilised area 108.2 of the mirror 108.1. It is self-evident, however, that with other variants of the disclosure at least for individual support elements 110.3 an arrangement or alignment of the axis of rotation 110.13 that deviates from this can be provided, provided that the axis of rotation 110.13 always has a direction component running parallel to the rotational axis of symmetry 108.3. Consequently any alignment of the axis of rotation 110.13 is possible, provided that the axis of rotation 110.13 does not lie in a plane that is perpendicular to the rotational axis of symmetry 108.3.

The result of this is that by means of the support element 110.3 a rotation of the mirror 108.1 around the rotational axis of symmetry 108.3 is also restricted. In this way use is made of the cognition that, due to the rotational symmetry of the optically utilised area 108.2, no remarkable benefit can be obtained anyway from adjusting the angular position of the mirror 108.1 around the rotational axis of symmetry 108.3 or that the imaging errors, which arise from a deviation of the rotational symmetry of the optically utilised area 108.2, can be corrected through suitable and sufficiently known measures at other points in the optical system in a simpler manner.

Hence according to the disclosure it is assumed that the desire for an adjustment of the angular position of the mirror 108.1 around the rotational axis of symmetry 108.3 is unnecessary, so that firstly it is possible, compared with the known hexapods, to dispense with a support structure and the possibly associated actuator system, and thus to design the support unit 110 in the manner described as a pentapod, resulting in a reduction in the complexity of the support device. In addition it is hereby nevertheless possible with the pentapod to create parallel kinematics with the advantages relating to control or setting of the position and/or orientation of the mirror 108.1.

As can be inferred from FIGS. 4 and 5, an actuator unit 110.15 engages with a support segment 110.14 of the support section 110.5. To this end a first end of a lever element 110.16 of the actuator unit 110.15 is rigidly connected with the support segment 110.14. The other end of the lever element 110.16 is connected by means of a further joint device 110.17 with an actuator 110.18 which in turn is supported by the support ring 110.4.

The lever element 110.16 and the joint device 110.17 in the present example have a monolithic design with the support section 110.5. It is self-evident, however, that with other variants of the disclosure a design can also be selected which is built from any combination of different components which are connected to one another through suitable connecting means (frictional connection and/or form-fit and/or material connection).

The actuator 110.18 can basically be designed in any suitable fashion as a force actuator or a displacement actuator, which operates on an arbitrary electrical and/or fluidic (in particular pneumatic) working principle or arbitrary combinations of these. The actuator 110.18 can for example be a simple piezo element which according to a voltage applied generates a specified displacement in its working direction. Similarly a pneumatic actuator or a so-called Lorentz actuator may be involved, which in each case generate a specified force in their working direction.

The actuator 110.18 (depending on whether it is built as a force actuator or a displacement actuator) is designed to generate, under the control of a control device 111, a defined force or a defined displacement in the direction of its working axis 110.19. This force or displacement is transferred via the joint device 110.17 to the associated end of the lever element 110.16 and via the lever element 110.16 brings about a moment $M_Y$ around the $Y_L$ axis in the support segment 110.14.

The support segment 110.14 (in the direction of flow of force of the support force through the support element 110.3) is arranged between the two first pivot joints 110.9 and 110.10 of the first joint group 110.6. The moment $M_Y$ therefore brings about a pivoting of the support segment 110.14 around the $Y_L$ axis which, because of the presence of three first pivot joints 110.8 to 110.10 brings about a change in the angle β between the two support segments 110.14 and 110.20 and thus a change in length of the support element 110.3 along its longitudinal axis 110.13 or the $Z_L$ axis. Consequently, in this way, similarly to known hexapods, an adjustment of the mirror 108.1 is therefore generated in the available degrees of freedom by means of a change in length of the support elements 110.3.

On the other hand, in a static state of the actuator 110.18 (thus a state without any change to its extension or force exerted in its working direction) a second degree of freedom 110.3 of the support element is thus restricted, that is the translation along the $Z_L$ axis.

It is self-evident that through the distance between the actuator 110.18 and the point of engagement of the lever element 110.16 with the support segment 110.14 amongst other things the ratio between the travel of the actuator 110.18 and the change in length of the support element 110.13 can be set.

It is also self-evident that, in the event that during operation of the imaging device 101 a change in length of the support element in both directions is desired or necessary, the support element 110.3 has a neutral position or a starting position, as shown in FIG. 5. In this neutral position the angle β between the two support segments 110.14 and 110.20 is not equal to 180°, so that depending on the direction of displacement at the actuator 110.18 a shortening or lengthening of the support element 110.3 along its longitudinal axis 110.13 can be achieved.

In the present example the pivot joints of the first joint group 110.6 and the second joint group 110.7 (in the direction of flow of force of the support force through the support element 110.3) are arranged in a manner sorted according to their direction of pivoting, i.e. the first pivot joints 110.8 to 110.10 are arranged next to one another or sequentially in the direction of flow of force. The same applies to the second pivot joints 110.11 and 110.12, which are also arranged next to one another or sequentially in the direction of the flow of support force. In this way a particularly large adjusting area for the respective support element 110.3 and thus ultimately for the mirror 108.1 is achieved.

It is self-evident, however, that with other variants of the disclosure it can also be provided that at least for one joint group no such sorting of the pivot joints exists. In particular the pivot joints of the two joint groups in the direction of flow of the support force can in each case alternate.

The joint device 110.17 is designed in such a way that the introduction of parasitic forces and moments in the support section 110.5 and thus ultimately in the mirror 108.1 is as far as possible prevented. In the present example the joint device 110.17 includes two third pivot joints 110.21, 110.22 and two fourth pivot joints 110.23, 110.24, wherein the third pivot joints 110.21, 110.22 in each case define a third pivot axis, which is parallel to the $Y_L$ axis, while the fourth pivot joints 110.23, 10.24 in each case define a fourth pivot axis, which is parallel to the $X_L$ axis. Consequently a third pivot axis therefore in each case runs transversely to a fourth pivot axis.

In this way firstly a decoupling in four degrees of freedom (namely in each case the translation in the direction of the $Y_L$ axis and the $X_L$ axis and the rotation around the $Y_L$ axis and the $X_L$ axis) is performed. On the other hand, with this design of the joint device 110.17 no further restriction of the degrees of freedom of the support section 110.5 occurs.

In the present example, as mentioned, all five support elements 110.3 have an identical design. It is self-evident, however, that with other variants of the disclosure it can also be provided that only individual support elements, in particular only one of the support elements, performs the described restricting of the degree of freedom of rotation around the rotational axis of symmetry 108.3, while the other support elements have a different design. Thus for example for only one of the support elements the design shown in FIG. 4 and FIG. 5 can be selected, while for the other support elements a design can be selected like that which for example is used for the known hexapods.

It is furthermore self-evident that for the support elements a different design can also be selected. Thus, for example, the support elements can be selected that are known from the tripods of FIGS. 5 to 10 of WO 2005/101131 A1 (Kugler et al.) cited at the outset.

Figure 6:
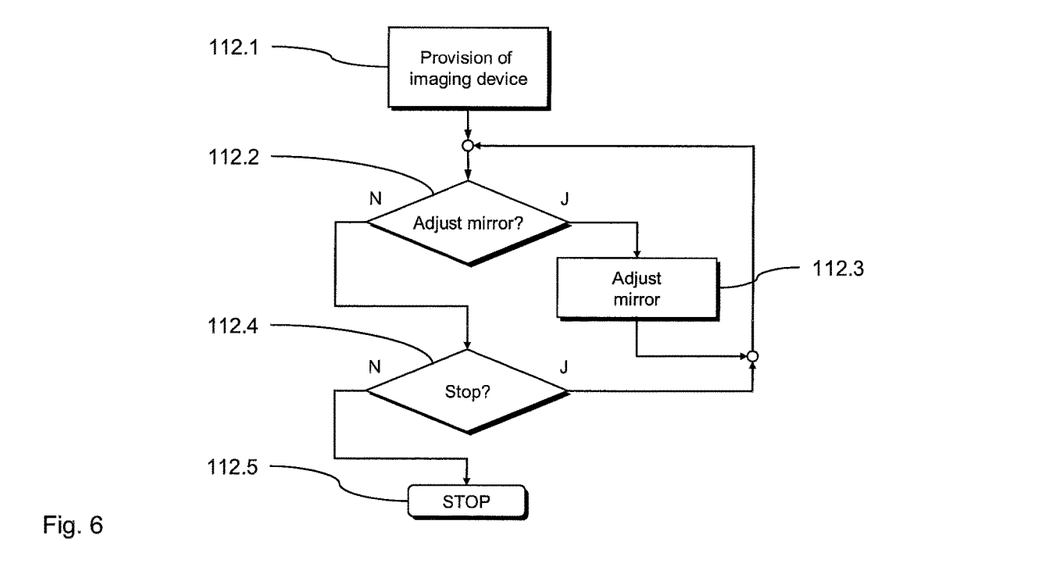
FIG. 6 is a block diagram of a preferred embodiment of the method according to the disclosure for supporting an optical element, which can be carried out with the optical imaging device of FIG. 1.

FIG. 6 shows a flow diagram of a preferred variant of the method according to the disclosure for supporting an optical element which is carried out with the imaging device 101.

Initially in a step 112.1 the components of the imaging device 101 are provided and positioned in the manner described above.

In a step 112.2 a check is made on whether the position and/or orientation of the mirror 108.1 should be altered. If so, the control device 111 controls the actuator 110.18 of the respective support element 110.3 in the desired manner in order to achieve the desired movement of the mirror 108.1 in the available five degrees of freedom.

In a step 112.3 a check is then made on whether a further change in the position and/or orientation of the mirror 108.1 should be made. If so, a jump back to step 112.2 is made.

Otherwise in a step 112.4 a check is made on whether the method sequence should be ended. If not, a jump back to step 112.3 is made. Otherwise the method sequence is ended in a step 112.5.

Second Embodiment

In the following by reference to FIG. 7 (which shows a view similar to the view of FIG. 5) a further preferred embodiment of the imaging device 201 according to the disclosure with a preferred embodiment of the optical module 209 according to the disclosure is described. In its structure and functionality the imaging device 201 basically corresponds to the imaging device 101, so that here only the differences will be covered. In particular similar components are given the same reference but increased by a value of 100, while identical components are given identical references. Unless otherwise stated in the following, regarding the characteristics of these similar components express reference is made to the explanations given above in relation to the first embodiment.

The imaging device 201 and the imaging device 101 differ merely by the design of the support elements 210.3. Thus, the lever element 210.16 with the support element 210.3, in contrast to the support element 110.3, is not connected with the support segment 110.14 but rigidly (for example monolithically) connected with the support segment 110.20, so that the actuator 110.18 via the lever element 210.16 brings about a change in the angle β between the two support segments 110.14 and 110.20 and, thus, a change in length of the support element 210.3 along its longitudinal axis or the $Z_L$ axis.

Third Embodiment

In the following by reference to FIG. 8 (which shows a view similar to the view of FIG. 5) a further preferred embodiment of the imaging device 301 according to the disclosure with a preferred embodiment of the optical module 309 according to the disclosure is described. In its structure and functionality the imaging device 301 basically corresponds to the imaging device 101, so that here only the differences will be covered. In particular similar components are given the same reference but increased by a value of 200, while identical components are given identical references. Unless otherwise stated in the following, regarding the characteristics of these similar components express reference is made to the explanations given above in relation to the first embodiment.

Again, the imaging device 301 and the imaging device 101 differ merely by the design of the support elements 310.3. Thus the actuator unit 310.15 of the support element 310.3, in contrast to the support element 110.3, is not supported on the support ring 110.4 but on a further lever element 310.17. The further lever element 310.17 is for its part rigidly connected (for example monolithically) with the support segment 110.20, so that the actuator 110.18, via the lever element 310.17 and the (compared to the lever element 110.16, if desired slightly modified) lever element 310.16, brings about a change in the angle β between the two support segments 110.14 and 110.20 and thus a change in length of the support element 310.3 along its longitudinal axis or the ZL axis. Consequently in this way an actuator unit 310.15 that is fully integrated within the support element 310.3 is therefore created which does not require a separate connection to the support ring 110.4.

It is self-evident in this context that with other variants of the disclosure it can also be provided that one of the two lever elements, on the ends of which the actuator 110.18 is supported, does not engage with a support element that is positioned between two pivot joints of the first joint group. Rather it can also be provided that this lever element engages with a support element that is positioned between a pivot joint of the first joint group and a pivot joint of the second joint group, as shown in FIG. 8 by the broken contour 313. It can similarly be provided that this lever element engages with a support segment, which is arranged between two pivot joints of the second joint group or between a pivot joint of the second joint group and the optical element.

Fourth Embodiment

In the following by reference to FIG. 9 a further preferred embodiment of the imaging device 401 according to the disclosure with a preferred embodiment of the optical module 409 according to the disclosure is described. In its structure and functionality the imaging device 401 basically corresponds to the imaging device 101, so that here only the differences will be covered. In particular similar components are given the same reference but increased by a value of 300, while identical components are given identical references. Unless otherwise stated in the following, regarding the characteristics of these similar components express reference is made to the explanations given above in relation to the first embodiment.

Figure 7:
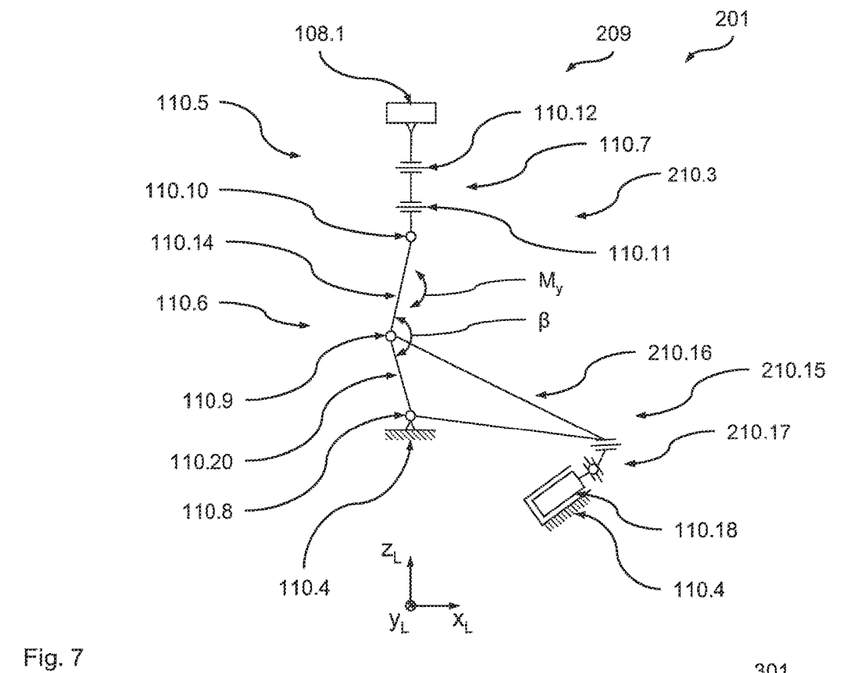
FIG. 7 is a mechanical equivalent diagram of a support element of a further preferred embodiment of the optical module according to the disclosure.
Figure 8:
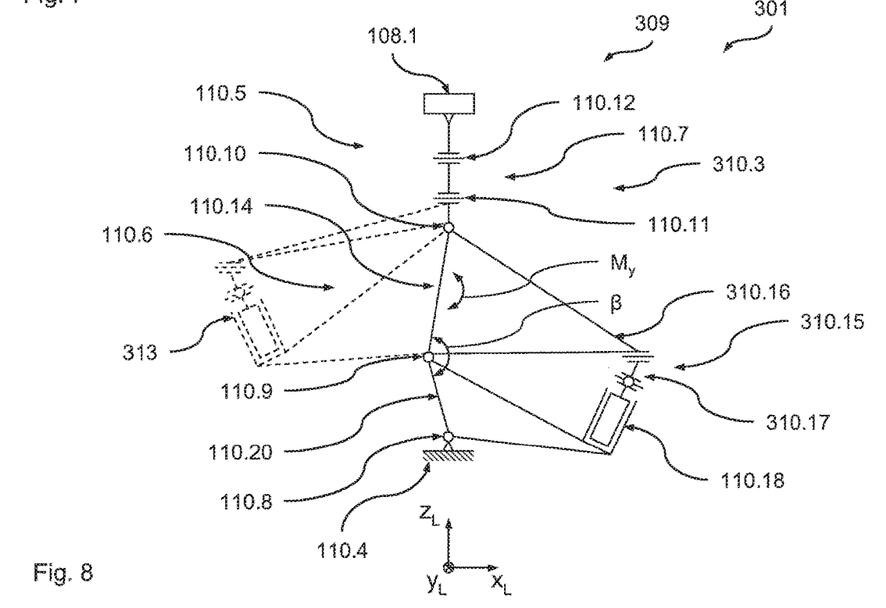
FIG. 8 is a mechanical equivalent diagram of a support element of a further preferred embodiment of the optical module according to the disclosure.
Figure 9:
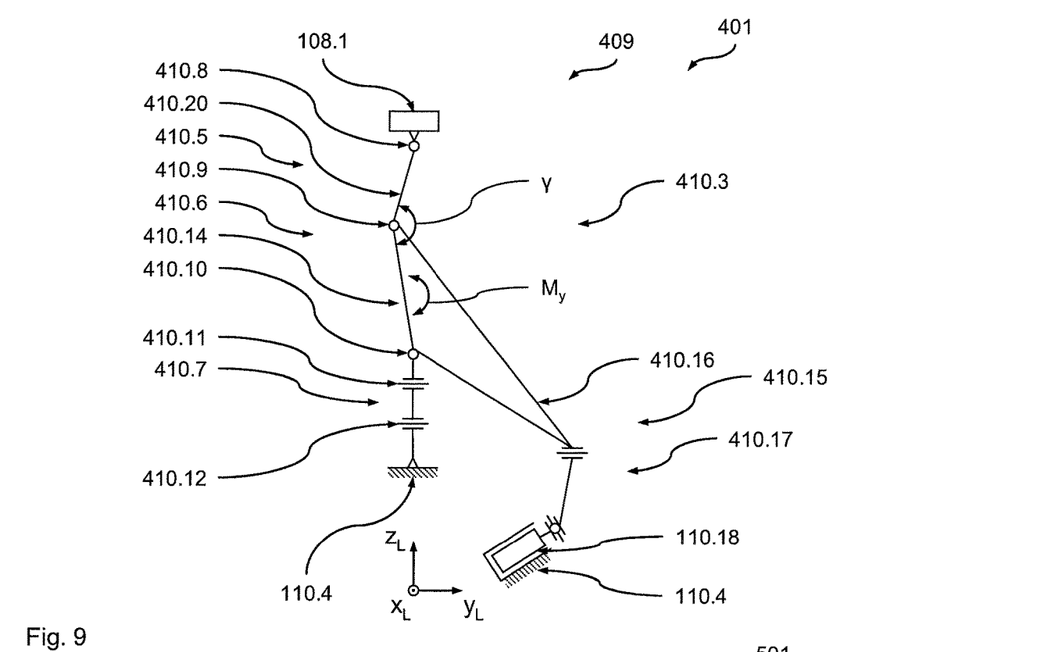
FIG. 9 is a mechanical equivalent diagram of a support element of a further preferred embodiment of the optical module according to the disclosure.

Here it should first be noted that the view in FIG. 9 is rotated through 90° (around the $Z_L$ axis) compared with FIGS. 5, 7 and 8. Again the imaging device 401 and the imaging device 101 differ merely by the design of the support elements 410.3. Thus the first joint group 410.6 here includes the pivot joints 410.8 to 410.10, which now in each case define a pivot axis parallel to the $X_L$ axis, while the second joint group 410.7 includes the pivot joints 410.11 and 410.12, which now in each case define a pivot axis parallel to the $Z_L$ axis.

The actuator unit 410.15 is supported on the one hand on the support ring 110.4 and on the other hand on the lever element 410.16, which for its part is rigidly (for example monolithically) connected with the support segment 410.14. Via the lever element 410.16 the actuator 110.18 thus brings about a change in the angle γ between the two support segments 410.14 and 410.20 and this in turn a change in length of the support element 410.3 along its longitudinal axis or the $Z_L$ axis.

Fifth Embodiment

Figure 10:
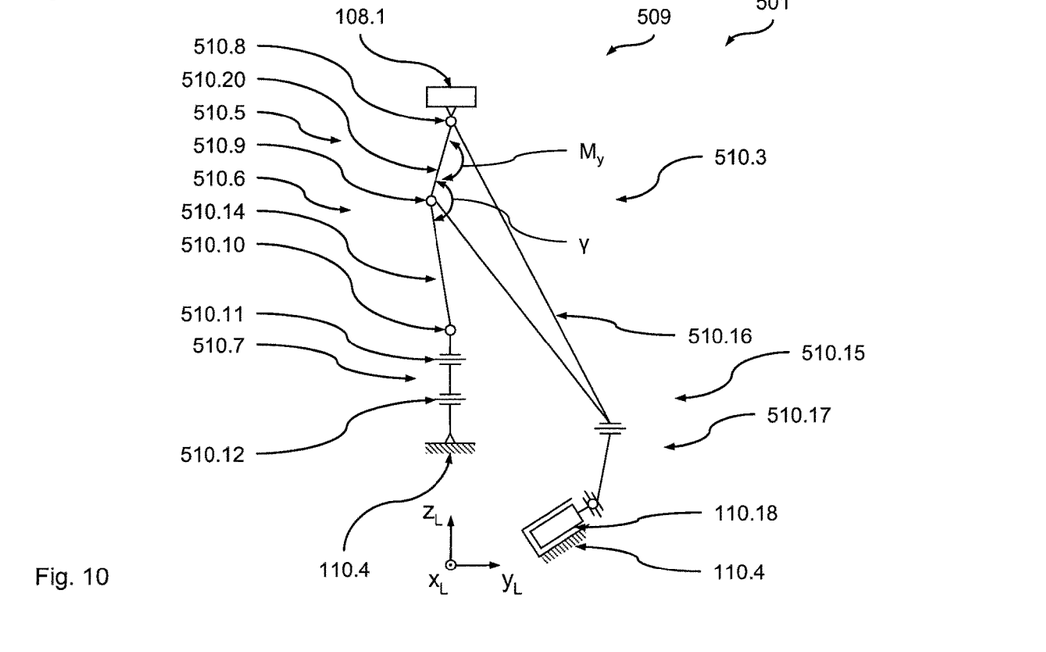
FIG. 10 is a mechanical equivalent diagram of a support element of a further preferred embodiment of the optical module according to the disclosure.

In the following by reference to FIG. 10 (which shows a view similar to the view from FIG. 9) a further preferred embodiment of the imaging device 501 according to the disclosure with a preferred embodiment of the optical module 509 according to the disclosure is described. In its structure and functionality the imaging device 501 basically corresponds to the imaging device 401, so that here only the differences will be covered. In particular similar components are given the same reference but increased by a value of 100, while identical components are given identical references. Unless otherwise stated in the following, regarding the characteristics of these similar components express reference is made to the explanations given above in relation to the fourth and first embodiment.

The imaging device 501 and the imaging device 401 differ merely by the design of the support elements 510.3. Thus the lever element 510.16 at the support element 510.3, in contrast to the support element 410.3, is not connected with the support segment 410.14 but rigidly (for example monolithically) connected with the support segment 510.20, so that the actuator 110.18 via the lever element 510.16 brings about a change in the angle γ between the two support segments 510.14 and 510.20 and thus a change in length of the support element 510.3 along its longitudinal axis or the $Z_L$ axis.

It is self-evident in this connection that with other variants of the disclosure in order to adjust the angle γ an actuator fully integrated within the support element can also be provided, as has been described in connection with the third embodiment (see FIG. 8).

Sixth Embodiment

Figure 11:
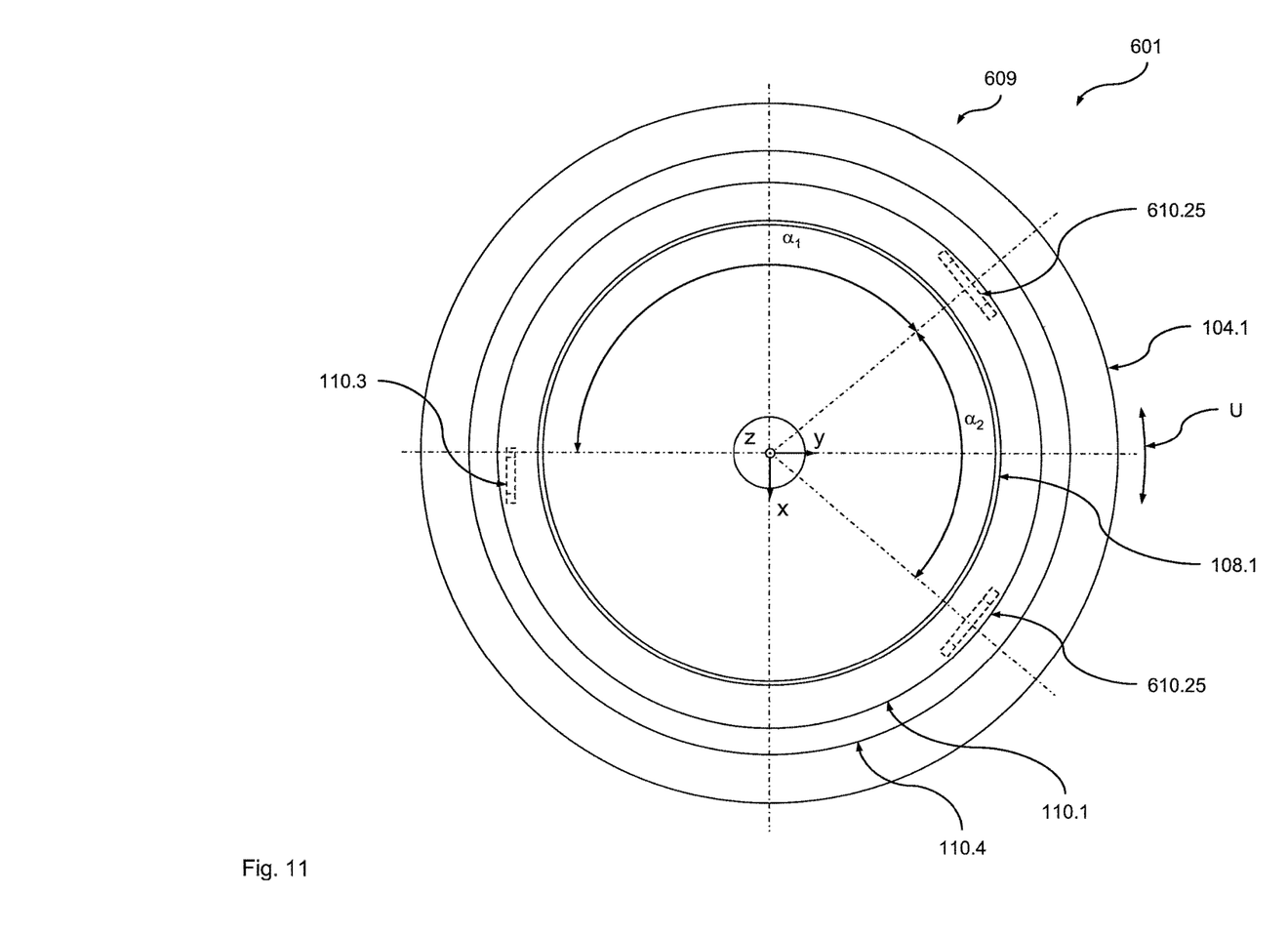
FIG. 11 is a top view of a further preferred embodiment of the optical module according to the disclosure.

In the following by reference to FIGS. 11 and 12 a further preferred embodiment of the imaging device 601 according to the disclosure with a preferred embodiment of the optical module 609 according to the disclosure is described. In its structure and functionality the imaging device 601 basically corresponds to the imaging device 101, so that here only the differences will be covered. In particular similar components are given the same reference but increased by a value of 500, while identical components are given identical references. Unless otherwise stated in the following, regarding the characteristics of these similar components express reference is made to the explanations given above in relation to the first embodiment.

The imaging device 601 and the imaging device 101 again differ merely in the design and arrangement of the support elements 110.3 and 610.3. While a support element 110.3 is designed and arranged as a monopod in the manner described above in connection with the first embodiment, support elements 610.3 are combined two at a time in the form of a bipod 610.25, the mechanical equivalent diagram of which is shown in FIG. 12 (in a view similar to the view of FIG. 5).

Figure 12:
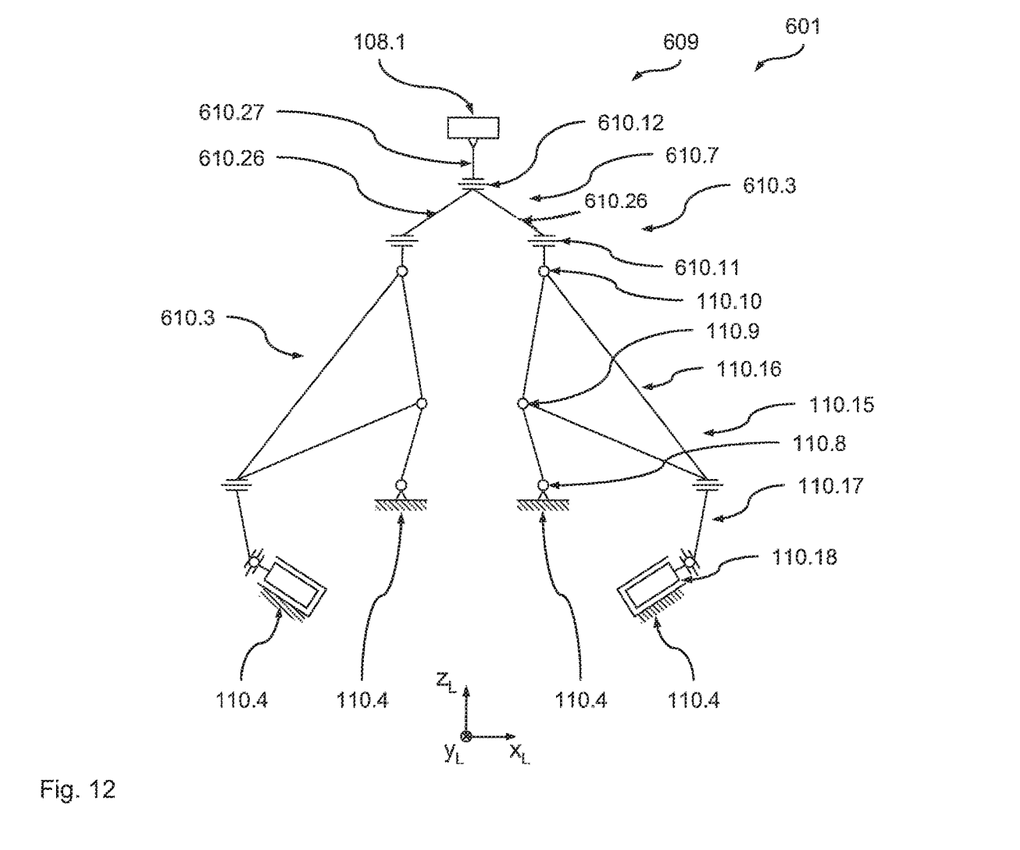
FIG. 12 is a mechanical equivalent diagram of a support element of the optical module of FIG. 11.

As can be inferred from FIG. 12, the support element 110.3 and the bipods 610.25 are rotated in relation to one another with reference to the Z axis in each case by an angle of $\alpha_1=140°$, so that the two bipods 610.25 are arranged rotated in relation to one another through an angle of $\alpha_2=80°$. It is self-evident, however, that with other variants of the disclosure another distribution of the support elements can also be selected. In particular different rotation angles between the monopod and the respective bipod can be provided. Furthermore, of course, just one bipod in combination with three monopods can be provided.

As can be inferred from FIG. 12, the two support elements 610.3 are combined to form the bipod 610.25 such that they share a common support segment 610.26, a common second pivot joint 610.12 and a common support segment 610.27. Furthermore, the support elements 610.3 (as mentioned), in particular with regard to the connection of the respective actuator unit 110.15, correspond to the design from the first embodiment, so that in this context reference is made to the explanations given above.

In this connection it is self-evident that with other variants of the disclosure another design of the bipod can also be provided. In particular it can be provided that only the support segment closest to the optical element is designed as a shared support element. It is also self-evident that with such a design as a bipod all variants of the connection of the actuator unit can also be created, as have been described above in the context of embodiments two to five.

The present disclosure has been described above exclusively using examples from the area of the exposure of wafers. It is self-evident, however, that the present disclosure can equally be used for any other applications or imaging methods, in particular at any wavelengths of the light used for imaging.

What is claimed is:

1. An optical module, comprising:
    an optical element configured to have an optically utilised area during use of the optical module, the optically utilised area defining a rotational axis of symmetry;
    a support structure; and
    a support unit comprising more than three support elements including a first support element, the support elements being configured to support the optical element, each support element having a first end and a second end, an area of the first end of each support element being connected to the optical element, and an area of the second end of each support element being connected to the support structure,
    wherein:
        the first support element is configured to restrict movement of the optical element in only one degree of freedom;
        the degree of freedom is a degree of freedom of rotation around an axis of rotation;
        the axis of rotation is aligned so that the axis of rotation has a direction component parallel to the rotational axis of symmetry; and
        the optical module is configured to be used in microlithography.

2. The optical module according to claim 1, wherein:
    the first support element comprises a joint group with a plurality of pivot joints;
    each pivot joint of the joint group defines a pivot axis; and
    the pivot axes of the pivot joints of the joint group are essentially parallel to one another.

3. The optical module according to claim 2, wherein the pivot axes of the pivot joints are transverse to the axis of rotation.

4. The optical module according to claim 2, wherein the joint group comprises three pivot joints.

5. The optical module according to claim 2, wherein:
    the first support element comprises a support segment between two of the pivot joints in a direction of a flow of support force through the first support element during use of the optical module;
    the optical module comprises an actuator unit that engages the support segment; and
    the actuator unit is configured to adjust the position and/or the orientation of the optical element.

6. The optical module according to claim 5, wherein:
    the actuator unit has a first end and a second end;
    an area of the first end of the actuator unit engages the first support element; and
    one of the following holds:
        an area of the second end of the actuator unit engages the support structure; or
        an area of the second end of the actuator unit engages a further support segment of the first support element adjacent to the support segment in the direction of flow of support force during use of the optical module.

7. The optical module according to claim 6, wherein:
    the actuator unit comprises an actuator and a lever arm;
    the lever arm is rigidly connected to the support segment;
    the actuator engages with the lever arm; and
    the actuator is configured to pivot the support segment around an axis parallel the pivot axis of the pivot joint.

8. The optical module according to claim 1, wherein:
    the first support element comprises first and second joint groups;
    the first joint group comprises a plurality of first pivot joints;
    each first pivot joint defines a first pivot axis;
    the first pivot axes are essentially parallel to one another
    the second joint group comprises a plurality of second pivot joints;
    each second pivot joint defines a second pivot axis;
    the second pivot axes are essentially parallel to one another; and
    the first pivot axis is transverse to the second pivot axis.

9. The optical module according to claim 8, wherein the second joint group comprises two second pivot joints.

10. The optical module according to claim 8, wherein the first pivot joints are arranged adjacent to one another in a direction of a flow of support force through the first support element during use of the optical module.

11. The optical module according to claim 1, wherein the support unit is a pentapod with precisely five support elements.

12. The optical module according to claim 1, wherein at least two support elements are arranged in the form of a bipod.

13. The optical module according to claim 12, wherein:
    each support element of the bipod comprises a plurality of pivot joints;
    in each case one support segment is arranged between two pivot joints in a direction of a flow of support force through the support during use of the optical module; and a support segment is designed as a shared support segment of the two support elements.

14. An optical imaging device, comprising:
an illumination device; and
a projection device,
wherein a device comprises an optical module according to claim 1, the device is selected from the group consisting of the illumination device and the projection device, and the optical imaging device is configured to be used in microlithography.

15. An optical module, comprising:
an optical element configured to have an optically utilised area during use, the optically utilised area defining a rotational axis of symmetry;
a support structure; and
a support unit comprising more than three support elements including a first support element, the support elements being configured to support the optical element, each support element having a first end and a second end, an area of the first end of each support element being connected to the optical element, and an area of the second end of each support element being connected to the support structure,
wherein:
the support unit is configured so that a degree of freedom of rotation of the optical element around the rotational axis of symmetry is restricted, while a position or orientation of the optical element in the other five degrees of freedom is spatially adjustable via the support unit; and
the optical module is configured to be used in microlithography.

16. An optical imaging device, comprising:
an illumination device; and
a projection device,
wherein a device comprises an optical module according to claim 15, the device is selected from the group consisting of the illumination device and the projection device, and the optical imaging device is configured to be used in microlithography.

17. The optical module according to claim 15, wherein:
the first support element comprises a joint group with a plurality of pivot joints;
each pivot joint of the joint group defines a pivot axis; and
the pivot axes of the pivot joints of the joint group are essentially parallel to one another.

18. The optical module according to claim 17, wherein the pivot axes of the pivot joints are transverse to the axis of rotation.

19. The optical module according to claim 17, wherein the joint group comprises three pivot joints.

20. The optical module according to claim 15, wherein:
the first support element comprises first and second joint groups;
the first joint group comprises a plurality of first pivot joints;
each first pivot joint defines a first pivot axis;
the first pivot axes are essentially parallel to one another
the second joint group comprises a plurality of second pivot joints;
each second pivot joint defines a second pivot axis;
the second pivot axes are essentially parallel to one another; and
the first pivot axis is transverse to the second pivot axis.

* * * * *

UNITED STATES PATENT AND TRADEMARK OFFICE
CERTIFICATE OF CORRECTION

PATENT NO. : 10,274,845 B2
APPLICATION NO. : 13/091457
DATED : April 30, 2019
INVENTOR(S) : Ivan Ivanov et al.

It is certified that error appears in the above-identified patent and that said Letters Patent is hereby corrected as shown below:

On the Title Page

Column 1 item (75) (Inventors): For inventor Burkhard Corves, delete "(DE)" and insert -- (BE) --, therefor.

In the Specification

Column 1, Line 8 (approx.): Delete "224.9-51," and insert -- 224.951, --, therefor.

Column 11, Line 27: Delete "ZL" and insert -- $Z_L$ --, therefor.

In the Claims

Column 13, Line 67: In Claim 2, delete "j oints;" and insert -- joints; --, therefor.

Column 14, Line 35: In Claim 7, delete "parallel the" and insert -- parallel to the --, therefor.

Signed and Sealed this
Twenty-fourth Day of September, 2019

Andrei Iancu
*Director of the United States Patent and Trademark Office*